US007251795B2

(12) United States Patent
Biswas et al.

(10) Patent No.: US 7,251,795 B2
(45) Date of Patent: Jul. 31, 2007

(54) CONNECTING VERILOG-AMS AND VHDL-AMS COMPONENTS IN A MIXED-LANGUAGE MIXED-SIGNAL DESIGN

(75) Inventors: Prasenjit Biswas, Lowell, MA (US); Ramesh S. Mayiladuthurai, Santa Clara, CA (US); Chandrashekar L. Chetput, Santa Clara, CA (US); Abhijeet Kolpekwar, New Berlin, WI (US)

(73) Assignee: Cadence Design Systems, Inc., San Jose, CA (US)

( * ) Notice: Subject to any disclaimer, the term of this patent is extended or adjusted under 35 U.S.C. 154(b) by 484 days.

(21) Appl. No.: 10/952,222

(22) Filed: Sep. 27, 2004

(65) Prior Publication Data
US 2006/0074626 A1 Apr. 6, 2006

(51) Int. Cl.
*G06F 17/50* (2006.01)
(52) U.S. Cl. .............................. 716/4; 716/1; 703/13
(58) Field of Classification Search ............ None
See application file for complete search history.

(56) References Cited

U.S. PATENT DOCUMENTS

| 6,226,780 B1* | 5/2001 | Bahra et al. ............... 716/18 |
| 6,466,898 B1* | 10/2002 | Chan ......................... 703/17 |
| 6,560,572 B1* | 5/2003 | Balaram et al. ............ 703/22 |
| 2002/0049576 A1* | 4/2002 | Meyer ........................ 703/14 |
| 2003/0154061 A1* | 8/2003 | Willis ......................... 703/4 |

OTHER PUBLICATIONS

E.Christen et al., "VHDL-AMS—A Hardware Description Language for Analog and Mixed-Signal Applications," IEEE Transactions on Circuits and Systems—II: Analog and Digital Signal Processing, vol. 46, No. 10, Oct. 1999, pp. 1263-1272.*
P.Frey et al., "Verilog-AMS: Mixed-Signal Simulation and Cross Domain Connect Modules," 2000 IEEE, pp. 103-108.*
Accellera, (Jan. 20, 2003). "*Analog & Mixed-Signal Extensions to Verilog HDL*", Accellera, Verilog-AMS Language Reference Manual, v.2.1, Table of Contents only, pp. v-xiv.
IEEE Standard, (Mar. 18, 1999). "*IEEE Standard VHDL Analog and Mixed-Signal Extensions*", IEEE Standard 1076.1-1999, Design Automation Standards Committee of the IEEE Computer Society, Approved Mar. 18, 1999, Table of Contents only, pp. viii-x.

* cited by examiner

*Primary Examiner*—Leigh M. Garbowski
(74) *Attorney, Agent, or Firm*—Morrison & Foerster LLP

(57) ABSTRACT

A method for connecting Verilog-AMS and VHDL-AMS components in a mixed-language mixed-signal design includes receiving a mixed-language mixed-signal design, where the mixed-language mixed-signal design comprises one or more VHDL-AMS and Verilog-AMS components, including a first VHDL-AMS component and a first Verilog-AMS component. The method further includes receiving a predetermined set of connection rules, resolving incompatibilities between the first VHDL-AMS component and the first Verilog-AMS component in accordance with the predetermined set of connection rules, and connecting the first VHDL-AMS component to the first Verilog-AMS component.

18 Claims, 9 Drawing Sheets

Connecting a Verilog-AMS analog component to a VHDL-AMS analog component (Case 1)

Connecting a Verilog-AMS digital component to a VHDL-AMS analog component (Case 2)

Connecting a Verilog-AMS analog component to a VHDL-AMS digital component (Case 3)

US 7,251,795 B2

CONNECTING VERILOG-AMS AND VHDL-AMS COMPONENTS IN A MIXED-LANGUAGE MIXED-SIGNAL DESIGN

FIELD OF THE INVENTION

The present invention relates to the field of integrated circuit design and verification. In particular, the present invention relates to a method for connecting Verilog-AMS and VHDL-AMS components in a mixed-language mixed-signal design.

BACKGROUND OF THE INVENTION

Existing analog and mixed-signal (AMS) simulators, such as the VHDL-AMS and Verilog-AMS simulators, have the capability to simulate pure VHDL-AMS and pure Verilog-AMS designs respectively. A detailed description of working with pure VHDL-AMS components is found in "IEEE Standard VHDL Analog and Mixed-Signal Extensions," published by IEEE-SA Standards Board on Dec. 23, 1999. And a detailed description of working with pure Verilog-AMS components is found in "Verilog-AMS Language Reference Manual—Analog & Mixed-Signal Extensions to Verilog HDL," published by Accellera International Inc. on Jan. 20, 2003. However, circuit designers are interested in using design components from both languages, and they do not want to be constrained to either the VHDL-AMS or the Verilog-AMS languages. The basic issue in supporting a mixed-language mixed-signal simulator lies in the lack of compatibility between the VHDL-AMS and Verilog-AMS languages.

In a mixed-language mixed-signal (MLMS) design where one or more VHDL-AMS and Verilog-AMS components are connected to each other, a number of possible connections may be encountered that require special processing. Table 1 illustrates four fundamental cases for supporting a mixed-language mixed-signal design environment when a Verilog-AMS component is connected to a VHDL-AMS component.

TABLE 1

|  | Verilog-AMS Component | VHDL-AMS Component |
| --- | --- | --- |
| Case 1 | Verilog-AMS analog object | VHDL-AMS analog object |
| Case 2 | Verilog-AMS digital object | VHDL-AMS analog object |
| Case 3 | Verilog-AMS analog object | VHDL-AMS digital object |
| Case 4 | Verilog-AMS unresolved net | VHDL-AMS digital or analog component |

Of the four fundamental cases listed in Table 1, Case 2 and Case 3 are not supported by the prior art simulators. Although the prior art simulators provide a limited support of Case 1, it is done without performing a compatibility check to ensure the connection between the Verilog-AMS analog object and the VHDL-AMS analog object is valid.

Similarly, although the prior art simulators provide a limited support of Case 4, there are a number of drawbacks with the prior art approaches. In particular, to support a connection between a Verilog-AMS unresolved net and a VHDL-AMS digital net, the Verilog-AMS unresolved net is forced to become a digital net. In addition, to support a connection between a Verilog-AMS unresolved net and a VHDL-AMS analog net, the Verilog-AMS unresolved net is forced to be an analog net. This approach is merely a temporary solution for ensuring that the nets that are connected across the language boundary belong to the same domain (digital-to-digital or analog-to-analog). However, the prior art approach does not follow the discipline resolution semantics established by the Verilog-AMS Language Reference Manual (LRM). Besides, this temporary solution does not work in the situation when a Verilog-AMS unresolved net is connected to a VHDL-AMS analog net and a VHDL-AMS digital net, because the unresolved net can be forced neither to an analog net nor to a digital net in that situation.

Moreover, the prior art approach in Case 4 is inflexible in supporting the connection of a Verilog-AMS unresolved net with VHDL-AMS analog port. This is because it uses only the nature of VHDL-AMS port in the discipline resolution of the unresolved Verilog-AMS net. In other words, the prior art approach does not take into account the hierarchical and library information of the nature of the VHDL-AMS analog port. Thus, it produces inaccurate mapping result between the Verilog-AMS unresolved net and the VHDL-AMS analog port.

Furthermore, a Verilog-AMS discipline name is case sensitive, whereas a VHDL-AMS nature name is case insensitive. In other words, in the VHDL-AMS language, names like "xyz" and "XYZ" are interpreted to be the same name. But in the Verilog-AMS language, these names are interpreted to be different names. The prior art simulators do not address the case of incompatibilities between the two languages when using the VHDL-AMS nature name in the Verilog-AMS discipline resolution process.

Finally, there are incompatibilities between the definition of Verilog-AMS disciplines and the definition of VHDL-AMS natures. The Verilog-AMS disciplines are defined as a global parameter (global scope), which affects all levels of hierarchy of the design. On the other hand, some VHDL-AMS natures may be defined as a local parameter (local scope), which affects only the specific level of hierarchy of the VHDL-AMS design where the VHDL-AMS nature is defined. Therefore, in the VHDL-AMS language, a nature name alone is not enough to uniquely identify a nature. For example, in a VHDL-AMS design, there may be more than one nature of the name "electrical" defined in the different hierarchies (scopes) of the VHDL-AMS design and these natures may be completely different from each other.

Therefore, there is a need to address the issues of the prior art simulators in enabling circuit designers to use design components from both Verilog-AMS and VHDL-AMS languages in a MLMS environment. In particular, there is a need to provide solutions to each of the four cases of Table 1 to enable connections between Verilog-AMS and VHDL-AMS components. In addition, there is a need to uniquely identify a VHDL-AMS nature by its selected name not only includes that nature's name but also includes the names of its relevant hierarchy (scope) and library information.

SUMMARY

A method for supporting analog-to-analog and analog-to-digital connections between Verilog-AMS and VHDL-AMS components is disclosed. The method extends the discipline resolution methodology in the Verilog-AMS environment to work with VHDL-AMS components in a mixed-language mixed-signal design environment. The method enables integrated circuit designers to make use of design components from both VHDL-AMS and Verilog-AMS languages.

In one embodiment of the present invention, a method for connecting Verilog-AMS and VHDL-AMS components in a mixed-language mixed-signal design includes receiving a mixed-language mixed-signal design, where the mixed-language mixed-signal design comprises one or more VHDL-AMS and Verilog-AMS components, including a first VHDL-AMS component and a first Verilog-AMS component. The method further includes receiving a predetermined set of connection rules, resolving incompatibilities between the first VHDL-AMS component and the first Verilog-AMS component in accordance with the predetermined set of connection rules, and connecting the first VHDL-AMS component to the first Verilog-AMS component.

BRIEF DESCRIPTION OF THE DRAWINGS

The aforementioned features and advantages of the invention as well as additional features and advantages thereof will be more clearly understood hereinafter as a result of a detailed description of embodiments of the invention when taken in conjunction with the following drawings.

Like numbers are used throughout the figures.

DESCRIPTION OF EMBODIMENTS

Methods and systems are provided for resolving incompatibilities of Verilog-AMS and VHDL-AMS languages in a mixed-language and mixed-signal environment. The following description is presented to enable any person skilled in the art to make and use the invention. Descriptions of specific techniques and applications are provided only as examples. Various modifications to the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

According to embodiments of the present invention, the incompatibilities (Table 1, Cases 1-4) between VHDL-AMS and Verilog-AMS components in a MLMS environment are addressed. Each of the cases is described below.

Note that a Verilog-AMS component may include a Verilog-AMS analog object, a Verilog-AMS digital object, or a Verilog-AMS unresolved net. A Verilog-AMS analog object may be a Verilog-AMS analog net or a Verilog-AMS analog port. A Verilog-AMS digital object may be a Verilog-AMS digital net or a Verilog-AMS digital port. Similarly, a VHDL-AMS component may include a VHDL-AMS analog object or a VHDL-AMS digital object. A VHDL-AMS analog object may be a VHDL-AMS analog net or a VHDL-AMS analog port. A VHDL-AMS digital object may be a VHDL-AMS digital net or a VHDL-AMS digital port.

Connecting a Verilog-AMS analog object to a VHDL-AMS analog object (Case 1)

Figure 1:
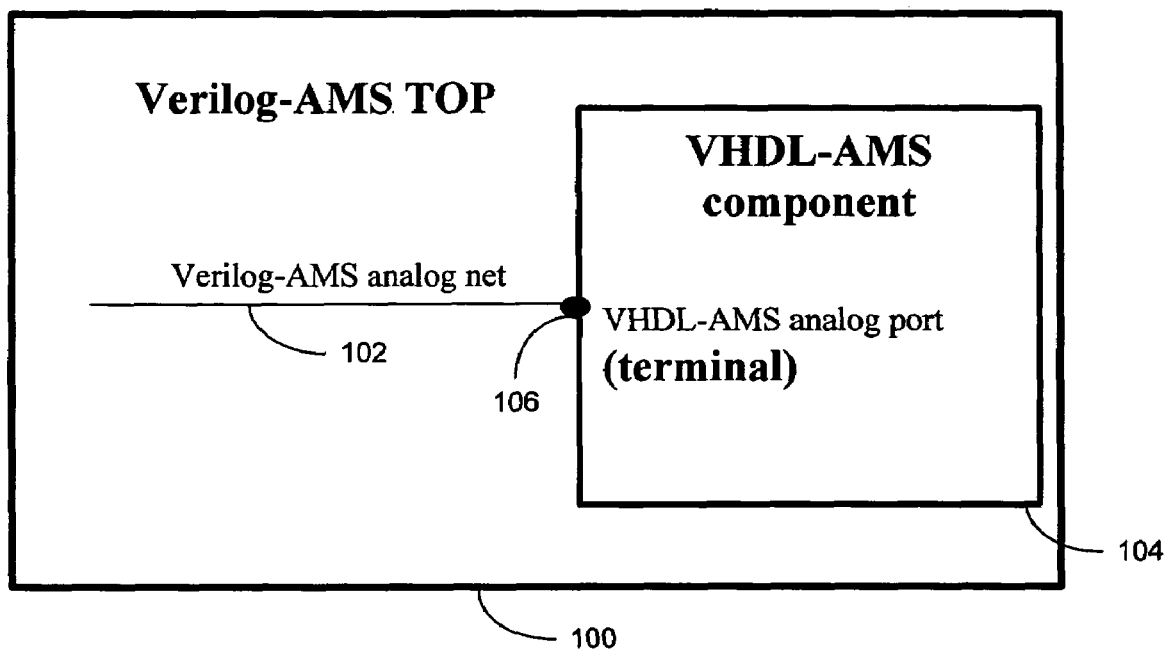
FIG. 1 illustrates a connection between a Verilog-AMS analog object and a VHDL-AMS analog object.

FIG. 1 illustrates a connection between a Verilog-AMS analog object and a VHDL-AMS analog object. As shown in FIG. 1, a Verilog-AMS Top module 100 includes a Verilog-AMS analog net 102 and a VHDL-AMS component 104. The VHDL-AMS component in turn includes a VHDL-AMS analog port 106, which is also referred to as a terminal. In order to make a connection, the discipline of the Verilog-AMS analog net is validated against the nature of the VHDL-AMS terminal.

In one embodiment, the Verilog-AMS analog node is connected to a VHDL-AMS terminal, and the equivalent discipline is mapped to the nature of the VHDL terminal. The name of the VHDL-AMS nature is provided to a design elaborator through a configuration file created by the user. Note that a design elaborator generally links different components of the design together to establish the hierarchy of the design, and binds all the nets across the hierarchy and create necessary infrastructure so that the design may be run with test inputs. In the absence of such a configuration file, a set of predefined default rules may be applied. If there is no equivalent discipline for a VHDL-AMS nature, then the Verilog-AMS analog to VHDL-AMS analog (terminal) connection is considered as invalid and a message is sent to notify the designer of this mapping error. Otherwise this connection is considered as valid if the discipline of the Verilog-AMS analog node is compatible to the equivalent discipline of the VHDL-AMS nature.

Syntax and Semantics of the User-Defined Configuration File

In another embodiment, a user-defined configuration file is used to choose an equivalent Verilog-AMS discipline to match a corresponding VHDL-AMS nature according to certain design requirements. Examples of the entries in the configuration file are shown as follows:

MAPN2D

VHDL_lib_name.<VHDL_scope_name>.nature_name

VERILOG_discipline_name

Where, MAPN2D is a keyword, and

VHDL_lib_name.<VHDL_scope_name>.nature_name is a case insensitive name of a VHDL-AMS nature. VHDL-AMS nature name is specified in the selected name format to uniquely identify it through its library and scope; and VERILOG_discipline_name is a case sensitive name of the equivalent Verilog-AMS analog discipline. In Verilog-AMS, the disciplines are defined in the global scope of the elaborated design hierarchy. As a result, no two Verilog-AMS disciplines have the same name. Thus, the Verilog-AMS discipline name by itself uniquely identifies the Verilog-AMS discipline.

In yet another embodiment, the MAPN2D function is used to map between a VHDL-AMS nature and a Verilog-AMS discipline. For example:

MAPN2D IEEE.electrical_systems.electrical electrical

The MAPN2D function specifies that if there is a VHDL-AMS terminal of nature electrical, where the nature electrical is defined in the package electrical_systems in library IEEE, then when this terminal is connected to a Verilog-AMS net/port in a mixed language mixed signal design, the equivalent discipline name of this terminal is interpreted to be electrical.

Predefined Default Rules

In the absence of a user-defined configuration, a set of predefined default rules is applied to map a VHDL-AMS nature to its equivalent Verilog-AMS discipline. Table 2 lists an example of a set of predefined default rules.

TABLE 2

| VHDL-AMS Nature | Equivalent Verilog-AMS discipline |
| --- | --- |
| IEEE.electrical_systems.electrical | electrical |
| IEEE.electrical_systems.magnetic | magnetic |
| IEEE.thermal_systems.thermal | thermal |
| IEEE.mechanical_systems.translational | kinematic |
| IEEE.mechanical_systems.translational_velocity | kinematic_v |
| IEEE.mechanical_systems.rotational | rotational |
| IEEE.mechanical_systems.rotational_velocity | rotational_omega |

For example, in a MLMS design, if there is a VHDL-AMS terminal having the nature translational as defined in the package mechanical_system of the IEEE library, then this terminal is mapped to an equivalent Verilog-AMS discipline name kinematic whenever it is connected to a Verilog-AMS component.

Figure 2:
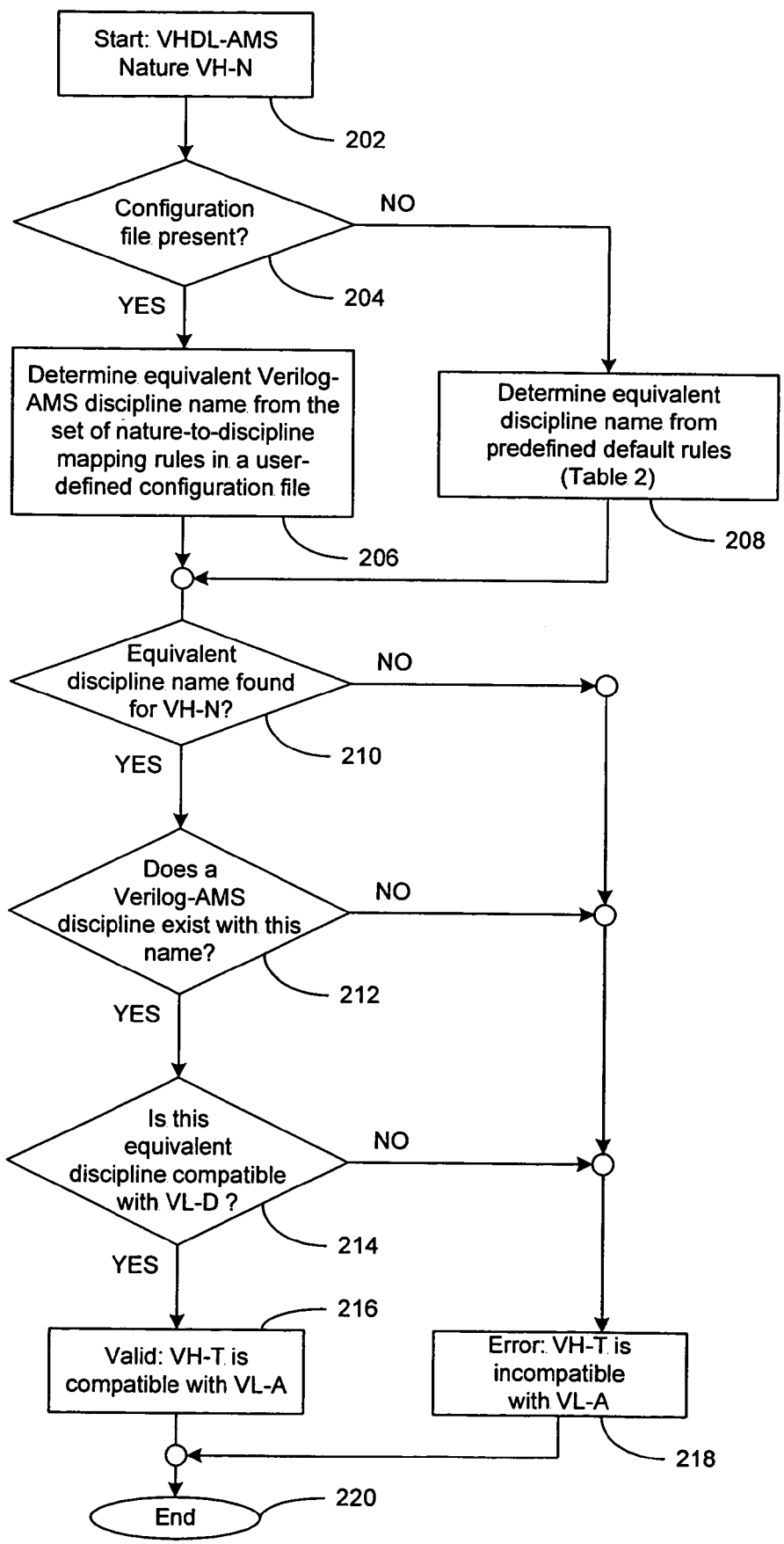
FIG. 2 illustrates a method for resolving incompatibilities between a VHDL-AMS terminal and a Verilog-AMS analog net according to an embodiment of the present invention.

FIG. 2 illustrates a method for resolving incompatibilities between a VHDL-AMS terminal and a Verilog-AMS analog net according to an embodiment of the present invention. The method validates the connection between the VHDL-AMS terminal VH-T of nature VH-N and the Verilog-AMS analog net VL-A of discipline VL-D. The method starts in step 202 where the method receives the VHDL-AMS terminal with nature VH-N.

In step 204, a first determination is made as to whether the configuration file is present. If the configuration file is present (204_YES), the method continues in step 206 where the method determines equivalent Verilog-AMS analog discipline name from a predetermined set of nature-to-discipline mapping rules in the user-defined configuration file. In the alternative, if the configuration file is not present (204_NO), the method moves to step 208 where the method determines the equivalent discipline name from a set of predetermined default rules (as shown in Table 2).

In step 210, a second determination is made as to whether the equivalent discipline name is found for VH-N. If an equivalent discipline name is found for VH-N (210-YES), the method continues in step 212. If not (210_NO), the method continues in step 218.

In step 212, a third determination is made as to whether a Verilog-AMS discipline exists with this name (VH-N). If a Verilog-AMS discipline exists with the name VH-N (212-YES), the method moves to step 214. Otherwise (212-NO), the method continues in step 218.

In step 214, a fourth determination is made as to whether this equivalent discipline found in step 210 is compatible with VL-D. If this equivalent discipline is compatible with VL-D (214_YES), the method moves to step 216. Else if this equivalent discipline is not compatible with VL-D (214-NO), the method continues in step 218.

In step 216, the VHDL-AMS terminal VH-T is determined to be compatible with the Verilog-AMS analog net VL-A and a valid connection may be made between the VHDL-AMS terminal and the Verilog-AMS analog net. In step 218, the VHDL-AMS terminal VH-T is determined to be not compatible with the Verilog-AMS analog net VL-A and an error message is sent to flag that a connection is not made. The method ends in step 220.

Connecting a Verilog-AMS Digital Object to a VHDL-AMS Analog Object (Case 2)

Figure 3A:
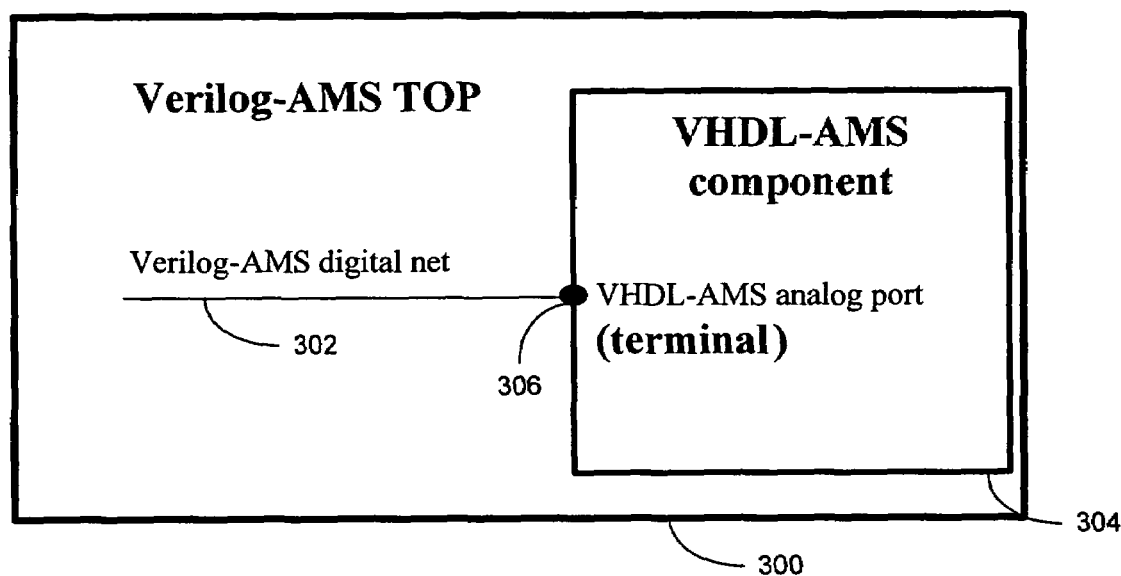
FIG. 3a illustrates a connection between a Verilog-AMS digital object and a VHDL-AMS analog object.
Figure 3B:
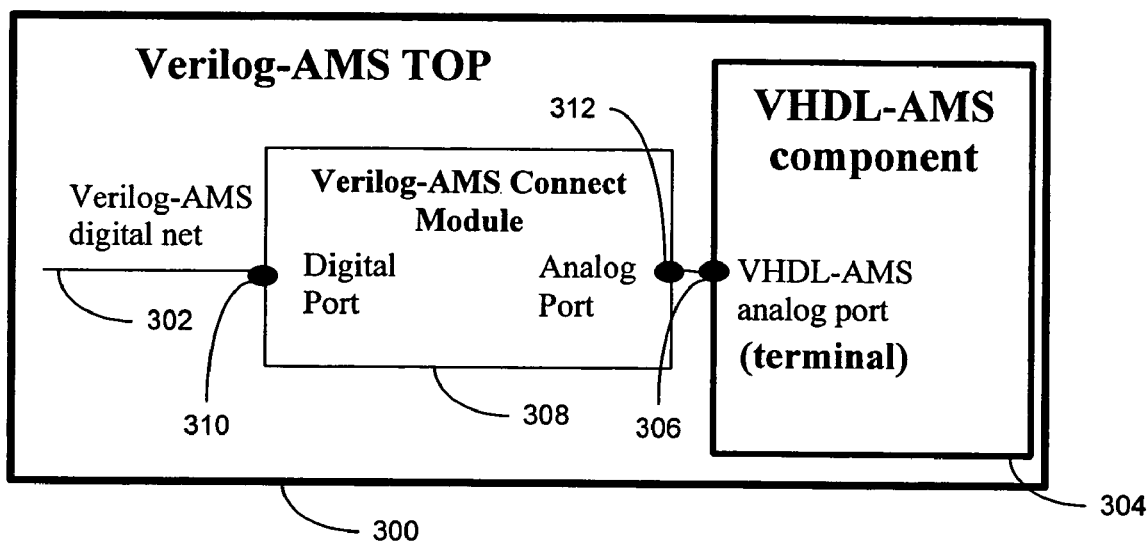
FIG. 3b illustrates a method for applying discipline resolution for resolving incompatibilities between the Verilog-AMS digital object and the VHDL-AMS analog object of FIG. 3a according to an embodiment of the present invention.

FIGS. 3a and 3b illustrate a method for resolving incompatibilities between a Verilog-AMS digital object and a VHDL-AMS analog object. FIG. 3a illustrates a connection between a Verilog-AMS digital object and a VHDL-AMS analog object. As shown in FIG. 3a, a Verilog-AMS Top module 300 includes a Verilog-AMS digital net 302 and a VHDL-AMS component 304. The VHDL-AMS component in turn includes a VHDL-AMS analog port 306, which is also referred to as a terminal. This connection may be supported by extending the procedures for the Verilog-AMS environment as described in the Verilog-AMS LRM to work in a mixed-language mixed-signal design containing both VHDL-AMS and Verilog-AMS components.

FIG. 3b illustrates a method for applying discipline resolution for resolving incompatibilities between the Verilog-AMS digital object and the VHDL-AMS analog object of FIG. 3a according to an embodiment of the present invention. In addition to the items (302, 304 and 306) described in FIG. 3a, a Verilog-AMS connect module 308 is inserted between the Verilog-AMS digital net 302 and the VHDL-AMS analog port 306 during the elaboration phase of design compilation. The Verilog-AMS connect module 308 includes a digital port 310 and an analog port 312. The digital port 310 is connected to the Verilog-AMS digital net 302 and the analog port 312 is connected to the terminal port 306 of the VHDL-AMS component.

The method for inserting the Verilog-AMS connect module 308 in a mixed-language mixed-signal design employs the following steps: 1) determine the equivalent Verilog-AMS analog discipline for the given VHDL-AMS terminal; 2) apply discipline resolution procedures for the Verilog-AMS environment as described in the Verilog-AMS LRM to determine a suitable Verilog-AMS connect module; and 3) insert a connect module for connecting the Verilog-AMS digital net/port with the VHDL-AMS analog net/port.

Connecting a Verilog-AMS Analog Object to a VHDL-AMS Digital Object (Case 3)

Figure 4A:
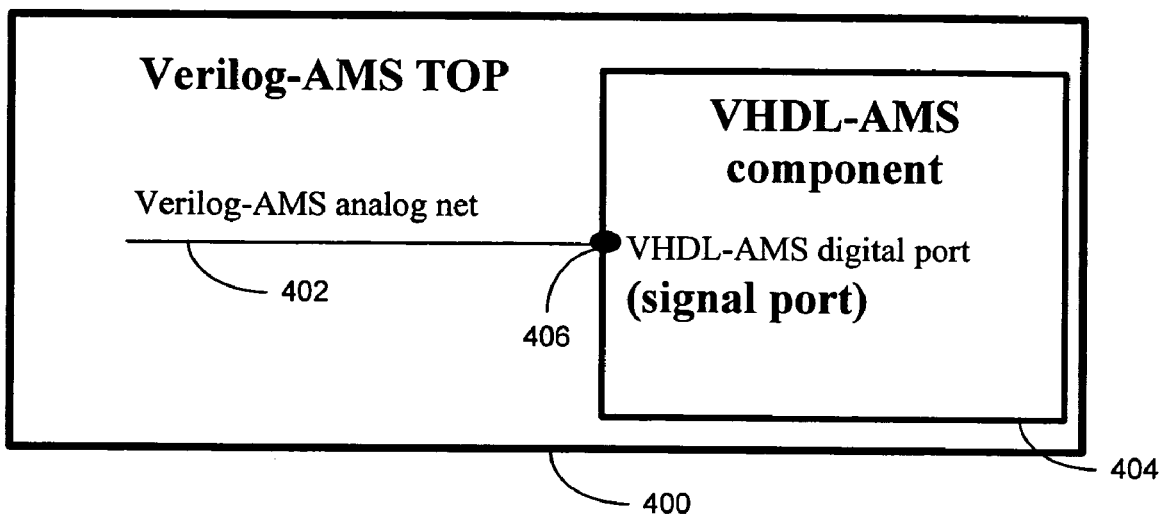
FIG. 4a illustrates a connection between a Verilog-AMS analog object and a VHDL-AMS digital object.
Figure 4B:
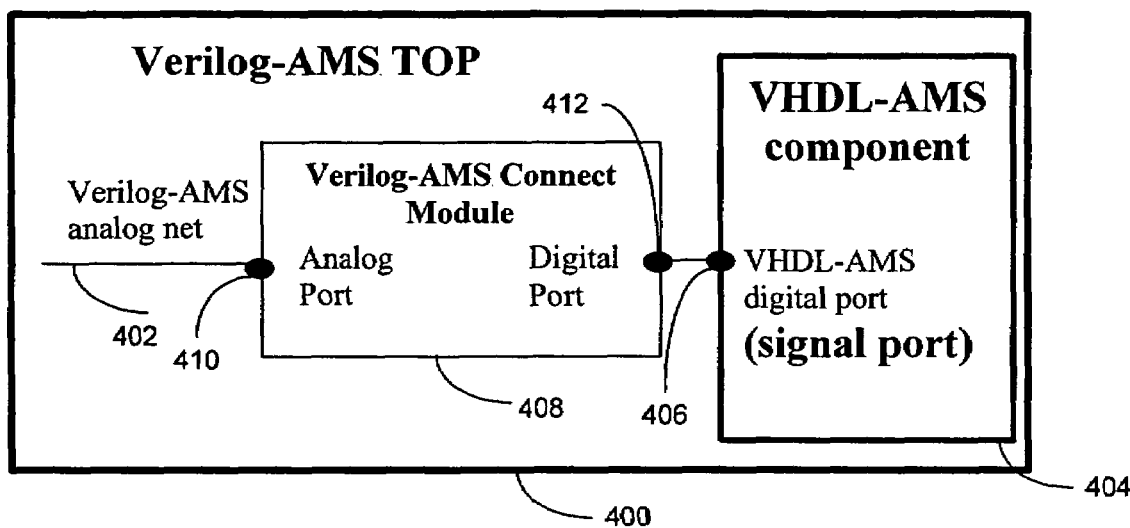
FIG. 4b illustrates a method for applying discipline resolution for resolving incompatibilities between the Verilog-AMS analog object and the VHDL-AMS digital object of FIG. 4a according to an embodiment of the present invention.

FIGS. 4a and 4b illustrate a method for resolving incompatibilities between a Verilog-AMS analog object and a VHDL-AMS digital object. FIG. 4a illustrates a connection between a Verilog-AMS analog object and a VHDL-AMS digital object. As shown in FIG. 4a, a Verilog-AMS top module 400 includes a Verilog-AMS analog net 402 and a VHDL-AMS component 404. The VHDL-AMS component in turn includes a VHDL-AMS digital port 406, which is also referred to as a signal port. This connection may be supported by extending the discipline resolution procedures for the Verilog-AMS environment as described in the Verilog-AMS LRM to work in a mixed-language mixed-signal design containing both VHDL-AMS and Verilog-AMS components.

FIG. 4b illustrates a method for applying discipline resolution for resolving incompatibilities between the Verilog- AMS analog object and the VHDL-AMS digital object of FIG. 4a according to an embodiment of the present invention. In addition to the items (402, 404 and 406) described in FIG. 4a, a Verilog-AMS connect module 408 is inserted between the Verilog-AMS analog net 402 and the VHDL-AMS digital port 406 during the elaboration phase of design compilation. The Verilog-AMS connect module 408 includes an analog port 410 and a digital port 412. The analog port 410 is connected to the Verilog-AMS analog net 402 and the digital port 412 is connected to the signal port 406 of the VHDL-AMS component.

In order to insert the Verilog-AMS connect module 408 across a mixed-language mixed-signal design as shown in FIG. 4b, the following data are obtained:

The discipline of the Verilog-AMS analog net.

The connected digital port of the VHDL-AMS component includes one of the following types from std_logic_1164 package of IEEE library:

std_ulogic std_logic std_ulogic_vector std_logic_vector

The equivalent Verilog-AMS discipline for this type of VHDL-AMS digital port is discrete discipline logic.

Using the above data, the method performs the following steps: 1) determine the equivalent Verilog-AMS digital discipline for the VHDL-AMS digital net/port; 2) apply discipline resolution procedures for the Verilog-AMS environment as described in the Verilog-AMS LRM to determine a suitable Verilog-AMS connect module; and 3) insert the connect module for connecting the Verilog-AMS analog net to the VHDL-AMS digital net/port.

Connecting a Verilog-AMS Unresolved Net to VHDL-AMS Digital or Analog Components (Case 4)

A Verilog-AMS unresolved net is a net whose discipline has not been specified when the net is declared. The discipline of this unresolved net is determined based on its connectivity using the discipline resolution method during design elaboration phase. In one embodiment, the discipline resolution procedures for the Verilog-AMS environment as described in the Verilog-AMS LRM are extended to work with mixed-language mixed-signal designs of both VHDL-AMS and Verilog-AMS components. The following example explains how VHDL-AMS digital or VHDL-AMS terminal ports/nets can participate in the discipline resolution process to determine the discipline of unresolved Verilog-AMS nets in a mixed-language mixed-signal design hierarchy.

Figure 5A:
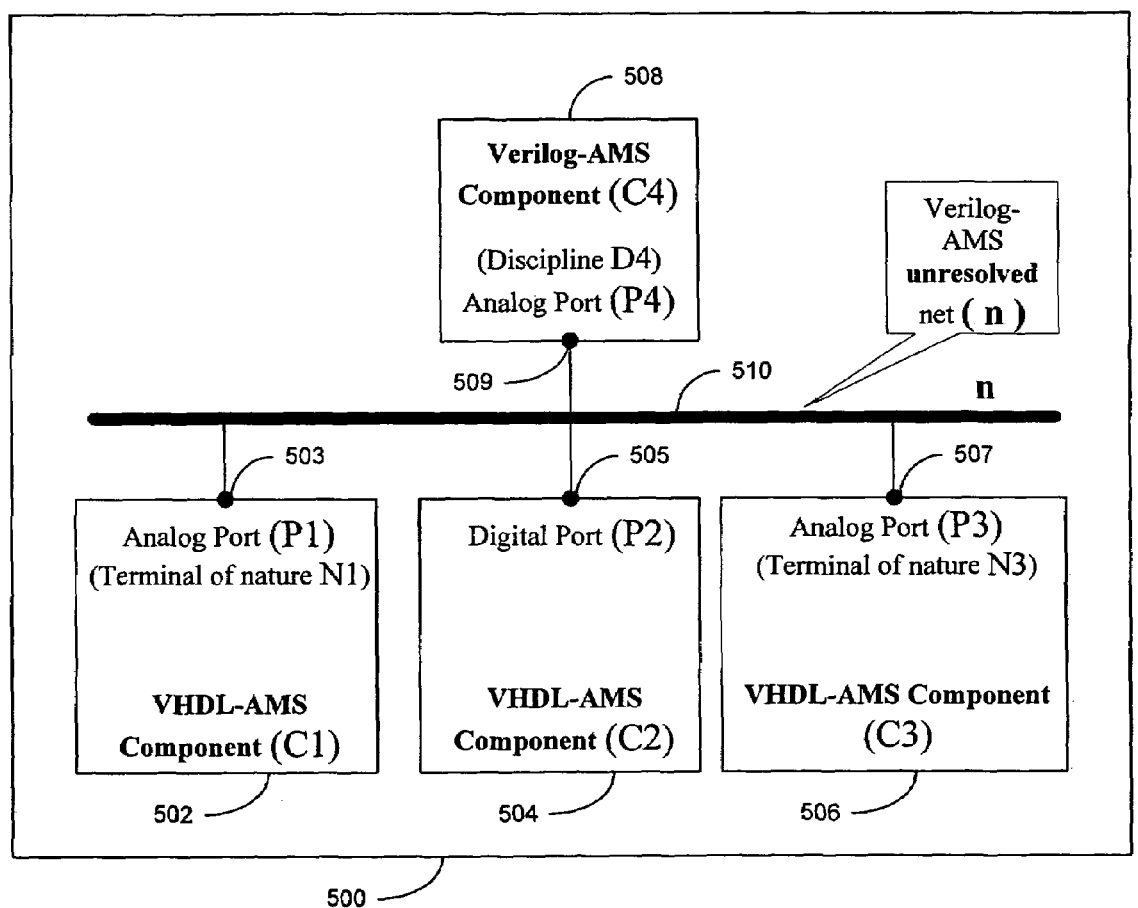
FIG. 5a illustrates a connection between a Verilog-AMS unresolved net and VHDL-AMS digital or analog components.

FIG. 5a illustrates a connection between a Verilog-AMS unresolved net and VHDL-AMS digital or analog components. As shown in FIG. 5a, VHDL-AMS components C1 (502), C2 (504), and C3 (506) are connected to a Verilog-AMS component C4 (508) though a Verilog-AMS unresolved net (n) 510. The port of each component has the following characteristics. Port P1 (503) of C1 is a VHDL-AMS analog port (terminal) of nature N1. Port P2 (505) of C2 is a VHDL-AMS digital port. Port P3 (507) of C3 is a VHDL-AMS analog port (terminal) of nature N3. Port P4 (509) of C4 is a Verilog-AMS analog port of analog discipline D4.

In this example, the VHDL-AMS natures N1 and N3 are defined in the VHDL-AMS scope of the design and the Verilog-AMS analog discipline D4 is defined in the Verilog-AMS part of this mixed-language mixed-signal design.

For the VHDL-AMS digital port P2 the following rule is applied:

Digital port P2 of the VHDL-AMS component C2 includes one of the std_ulogic, std_logic, std_ulogic_vector, or std_logic_vector types from std_logic_1164 package of IEEE library. Equivalent Verilog-AMS discipline for such a VHDL-AMS digital port is discrete discipline logic.

On the other hand, for each one of the VHDL-AMS analog (terminal) ports P1 and P3, the equivalent Verilog-AMS analog discipline is determined as described in Case 1 above.

Figure 5B:
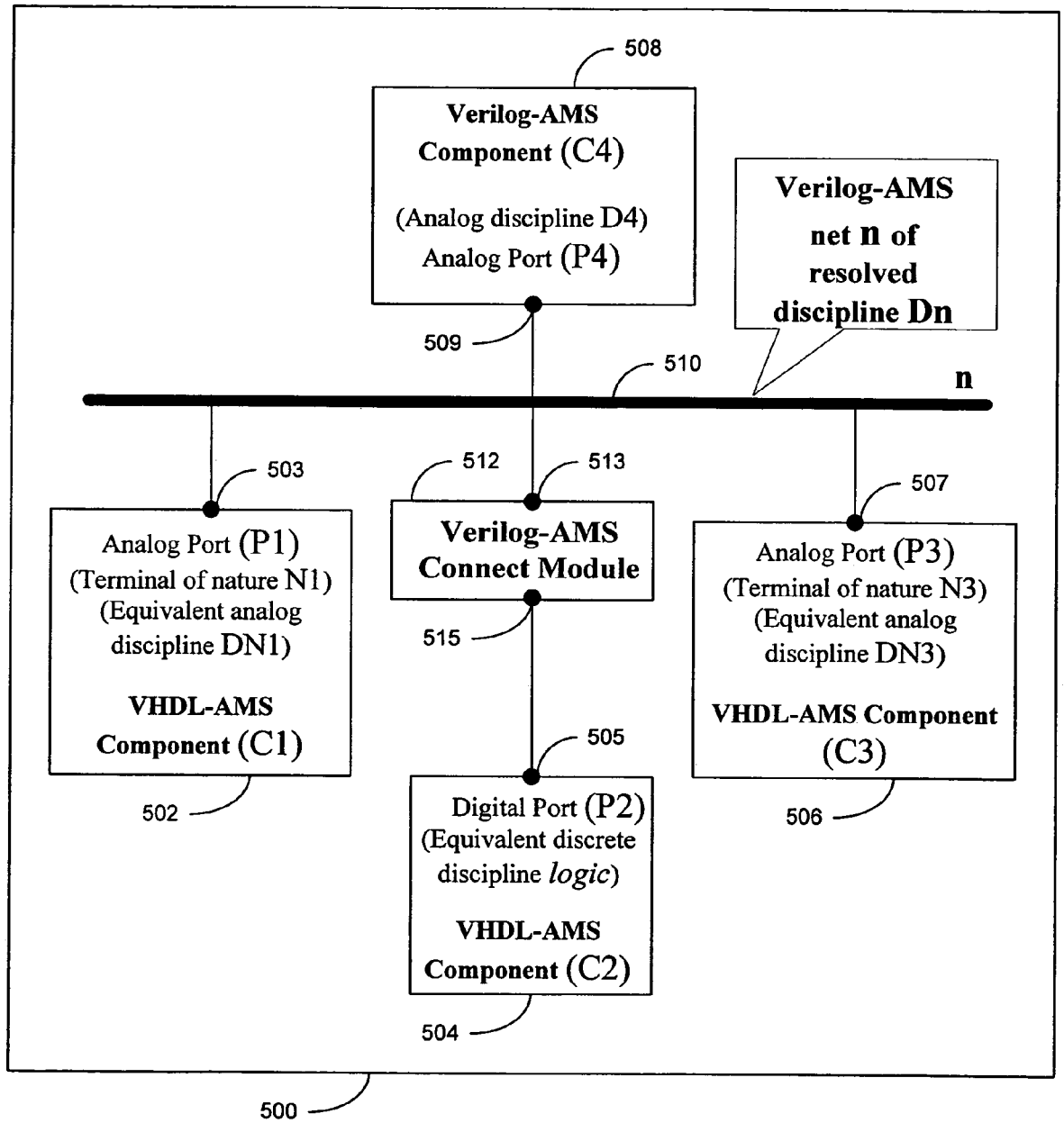
FIG. 5b illustrates a method for applying discipline resolution for resolving the Verilog-AMS net 510 of FIG. 5a according to an embodiment of the present invention.

FIG. 5b illustrates a method for applying discipline resolution for resolving the Verilog-AMS net 510 of FIG. 5a according to an embodiment of the present invention. In addition to the items (502 to 510) described in FIG. 5a, a Verilog-AMS connect module 512 is inserted between the VHDL-AMS component 504 and the Verilog-AMS net 510. The Verilog-AMS connect module 512 includes an analog port 513 coupling to the Verilog-AMS net 510 and a digital port 515 coupling to the digital port 505 of the VHDL-AMS component (C2) 504. In this example, the equivalent Verilog-AMS discipline of VHDL-AMS nature N1 is DN1, and equivalent Verilog-AMS discipline of VHDL-AMS nature N3 is DN3.

In this situation, in order to perform the discipline resolution (as described in Section 8.4 of the Verilog-AMS LRM), one of the following two conditions has to be true: 1) if DN1, DN3 and D4 are the same discipline, namely Dn, then the resolved discipline of net n is Dn; and 2) else if DN1, DN3 and D4 are not the same discipline, then this mixed-language mixed-signal design has a set of user-defined Verilog-AMS connection rules similar to the connect-resolveto statement below for supporting this connection.

connect DN1, DN3, D4 resolveto Dn.

Based on the set of user-defined Verilog-AMS connection rules, the resolved discipline of net n is Dn, which is connected to the three analog nets of disciplines DN1, DN3 and D4. Note that the connect-resolveto statement is a Verilog-AMS language feature. The syntax and semantics of this statement are defined in the Verilog-AMS LRM. The connect-resolveto statement is used to determine the resolved Verilog-AMS discipline of a net, which is connected to multiple Verilog-AMS analog nodes of different disciplines.

Figure 6:
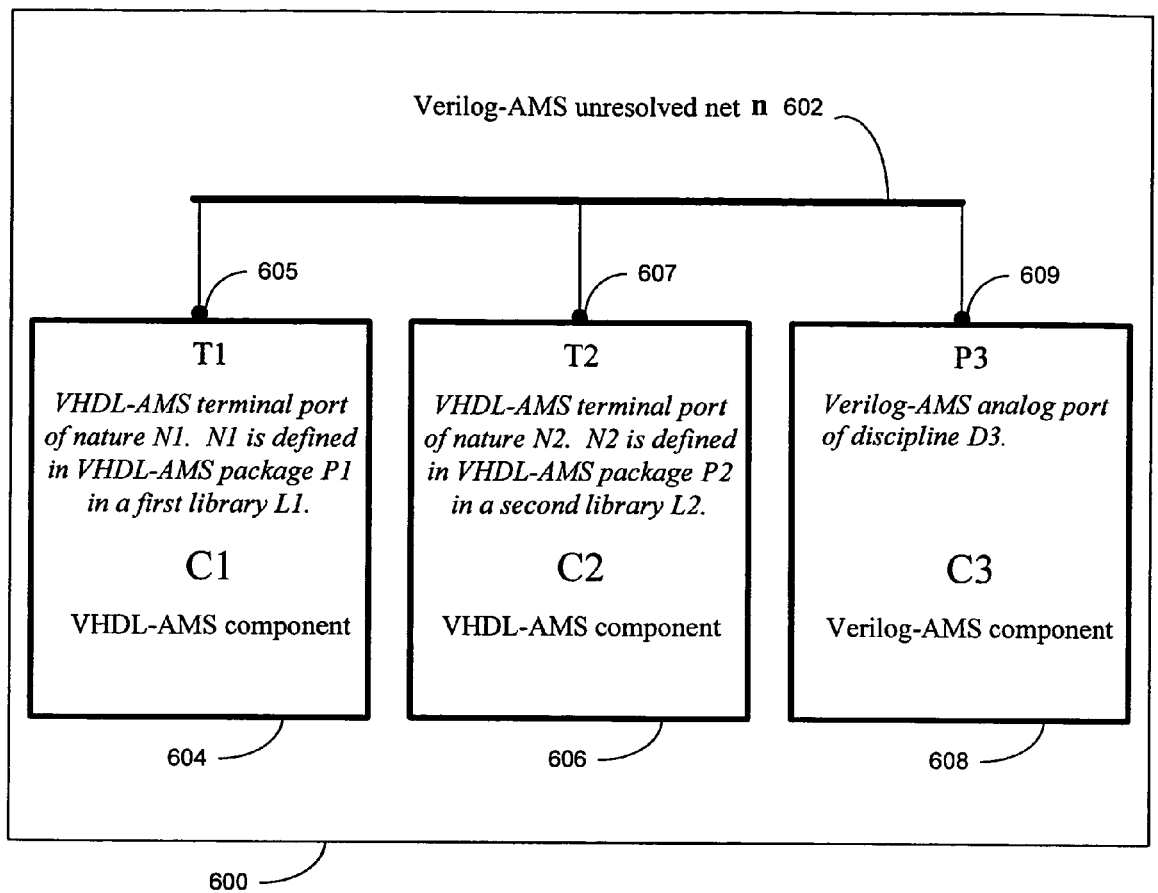
FIG. 6 illustrates another example of mapping VHDL-AMS nature to Verilog-AMS discipline according to an embodiment of the present invention.

FIG. 6 illustrates another example of mapping VHDL-AMS nature to Verilog-AMS discipline according to an embodiment of the present invention. As shown in FIG. 6, the design includes a Verilog-AMS unresolved net (n) 602, a first VHDL_AMS component (C1) 604, a second VHDL-AMS component (C2) 606, and a Verilog-AMS component (C3) 608. The Verilog-AMS unresolved net (n) 602 is connected to the following ports:

i. Terminal port (T1) 605 of the first VHDL-AMS component C1. The nature of T1 is N1, which is defined in a VHDL-AMS package P1 in a first library L1.

ii. Terminal port (T2) 607 of the second VHDL-AMS component C2. The nature of T2 is N2, which is defined in a VHDL-AMS package P2 in a second library L2.

iii. Analog port (P3) 609 of the Verilog-AMS component (C3) 608. The discipline of P3 is D3.

In this approach, the configuration file for this mixed-language mixed-signal design has the following MAPN2D rules:

| MAPN2D | L1.P1.N1 | D1 |
|---|---|---|
| MAPN2D | L2.P2.N2 | D2 |

Note that L1.P1.N1 in configuration file makes reference to VHDL-AMS nature N1 of terminal port T1, and L2. P2. N2 makes reference to nature N2 of terminal port T2.

In the VHDL-AMS language, a nature of a VHDL-AMS component may not be uniquely identified by a name like "electrical," because there may be multiple natures defined with name "electrical" in different scopes of the VHDL-AMS design. These natures, which have the same name "electrical," may be incompatible with each other. For example, if inside the VHDL-AMS package P2, there is another nature defined with name N1, then in the complete design there are two natures having the name N1, one defined in package P1 and the other in package P2. In the configuration file if the nature names are declared in the format such as MAPN2D N1 D1, then the nature name N1 alone is insufficient to determine whether N1 belongs to package P1 or belongs to package P2. Similarly, it is not clear whether D1 is the equivalent discipline of nature N1 of package P1, or Nature N1 of package P2. Note that the N1 of P1 may be different than the N1 of P2, even though they have the same name.

The following steps are performed to resolve the discipline of net n by using the selected name of the VHDL-AMS nature, including the name of its parent scope and its corresponding library. In this example, the discipline of the unresolved net (n) is the resolved discipline of L1.P1.N1, L2.P2.N2, and D3.

First, the equivalent discipline of nature N1 is determined. In this step, the complete selected name of the nature N1 is created, which is L1.P1.N1. Since VHDL-AMS name space is case insensitive, the name may take the form of upper, lower or a mixture of upper and lower cases. Next, the name L1.P1.N1 is searched in the configuration file, which contains the above mentioned MAPN2D rules. Using the configuration file, the equivalent Verilog-AMS discipline of this nature is determined to be D1.

Second, the equivalent discipline of nature N2 is determined. In this step, the same procedure used to determine N1 is followed to determine the discipline of N2, which has the selected name L2.P2.N2. Using the configuration file, the equivalent Verilog-AMS discipline of N2 is determined to be D2.

Third, the resolved discipline of the Verilog-AMS disciplines D1, D2, and D3 is determined. In this step, for a successful discipline resolution (as described in Section 8.4 of the Verilog-AMS LRM), one of the following two conditions has to be true: 1) if D1, D2 and D3 are the same discipline, namely Dn, then the resolved discipline of net n is Dn; or 2) if D1, D2 and D3 are not the same discipline, then this mixed-language mixed-signal design has a set of user-defined Verilog-AMS connection rules similar to the connect-resolveto statement below to support this connection.

connect D1, D2, D3 resolveto Dn.

Using the set of user-defined connection rules, the resolved discipline of net n is determined to be Dn, which is connected to the three analog nets of disciplines D1, D2 and D3. Note that the natures N1 and N2 of VHDL-AMS terminal ports are identified with a selected name format. For example, the selected name for N1 is L1.P1.N1 which identifies this nature N1 explicitly not only by its name (N1) but also by the name of its scope (VHDL-AMS package P1 where N1 is defined) and the corresponding library (L1).

There are a number of benefits provided by the present invention. First, it supports the four classes of connections between a Verilog-AMS component and a VHDL-AMS component as described in Table 1 above. Second, the name of the VHDL-AMS nature is not used directly in the discipline resolution procedures. Instead, an equivalent Verilog-AMS discipline name of the VHDL-AMS nature is determined, and the equivalent Verilog-AMS discipline is used in the discipline resolution procedures. Third, a user has the flexibility to specify the name of an equivalent discipline for a VHDL-AMS nature, in a set of user-defined nature-to-discipline mapping rules specified in a configuration file. The user is given control of the mapping between VHDL-AMS natures and Verilog-AMS disciplines and may create user-defined nature-to-discipline mapping rules according to particular design requirements. Fourth, the method removes the need for matching names of a Verilog-AMS discipline with a VHDL-AMS nature. Instead, the selected name (i.e. the name with complete scope and library information) of the nature of a VHDL-AMS component is first determined, and then a user-defined configuration file is used to determine the equivalent discipline for this nature. Therefore, the method provides a flexible solution for resolving incompatibilities between VHDL-AMS and Verilog-AMS components in a mixed-language mixed-signal design.

One skilled in the relevant art will recognize that many possible modifications and combinations of the disclosed embodiments may be used, while still employing the same basic underlying mechanisms and methodologies. The foregoing description, for purpose of explanation, has been written with references to specific embodiments. However, the illustrative discussions above are not intended to be exhaustive or to limit the invention to the precise forms disclosed. Many modifications and combinations are possible in view of the above teachings. The embodiments were chosen and described to explain the principles of the invention and its practical applications, and to enable others skilled in the art to best utilize the invention and various embodiments with various modifications as are suited to the particular use contemplated.

What is claimed is:

1. A method for connecting Verilog-AMS and VHDL-AMS components in a mixed-language mixed-signal design, comprising:

receiving a mixed-language mixed-signal design, wherein the mixed-language mixed-signal design comprises one or more VHDL-AMS and Verilog-AMS components, including a first VHDL-AMS component and a first Verilog-AMS component;

receiving a predetermined set of connection rules;

resolving incompatibilities between the first VHDL-AMS component and the first Verilog-AMS component in accordance with the predetermined set of connection rules; and connecting the first VHDL-AMS component to the first Verilog-AMS component.

2. The method of claim 1, wherein the first Verilog-AMS component comprises a Verilog-AMS analog object, wherein the Verilog-AMS analog object comprises an element selected from the group consisting of Verilog-AMS analog net and Verilog-AMS analog port.

3. The method of claim 1, wherein the first Verilog-AMS component comprises a Verilog-AMS digital object, wherein the Verilog-AMS digital object comprises an element selected from the group consisting of Verilog-AMS digital net and Verilog-AMS digital port.

4. The method of claim 1, wherein the first Verilog-AMS component comprises a Verilog-AMS unresolved net.

5. The method of claim 1, wherein the first VHDL-AMS component comprises a VHDL-AMS analog object, wherein the VHDL-AMS analog object comprises an element selected from the group consisting of VHDL-AMS analog net and VHDL-AMS analog port.

6. The method of claim 1, wherein the first VHDL-AMS component comprises a VHDL-AMS digital object, wherein the VHDL-AMS digital object comprises an element selected from the group consisting of VHDL-AMS digital net and VHDL-AMS digital port.

7. The method of claim 1, wherein the predetermined set of connection rules comprises a set of connect-resolve to statements and a set of nature-to-discipline mapping rules, wherein the set of nature-to-discipline mapping rules includes a set of default rules and a set of user-defined rules.

8. The method of claim 1, wherein resolving incompatibilities comprises:
    verifying a connection between a Verilog-AMS analog object and a VHDL-AMS analog object.

9. The method of claim 8, wherein verifying comprises:
    determining an equivalent Verilog-AMS discipline name for the VHDL-AMS analog object in accordance with the predetermined set of connection rules; and
    applying discipline resolution procedures on the equivalent Verilog-AMS discipline name of the VHDL-AMS analog object to verify the validity of the connection.

10. The method of claim 1, wherein resolving incompatibilities comprises establishing a connection between a Verilog-AMS digital object and a VHDL-AMS analog object.

11. The method of claim 10, wherein establishing comprises:
    determining an equivalent Verilog-AMS analog discipline for the VHLD-AMS analog component;
    applying discipline resolution procedures for determining a connect module; and
    inserting the connect module for connecting the Verilog-AMS digital object and the VHDL-AMS analog object.

12. The method of claim 11, wherein the connect module comprises:
    a digital port for interfacing with the Verilog-AMS digital object; and
    an analog port for interfacing with the VHDL-AMS analog object.

13. The method of claim 1, wherein resolving incompatibilities comprises establishing a connection between a Verilog-AMS analog object and a VHDL-AMS digital object.

14. The method of claim 13, wherein establishing comprises:
    determining an equivalent Verilog-AMS digital discipline for the VHLD-AMS digital component;
    applying discipline resolution procedures for determining a connect module; and
    inserting the connect module for connecting the Verilog-AMS analog object and the VHDL-AMS digital object.

15. The method of claim 14, wherein the connect module comprises:
    a digital port for interfacing with the VHDL-AMS digital object; and
    an analog port for interfacing with the Verilog-AMS analog object.

16. The method of claim 1, wherein resolving incompatibilities comprises establishing a connection between a Verilog-AMS unresolved net and one or more VHDL-AMS analog and digital components.

17. The method of claim 16, wherein establishing comprises:
    determining equivalent Verilog-AMS disciplines for the one or more VHLD-AMS analog and digital components;
    applying discipline resolution procedures for determining corresponding connect modules; and
    inserting the connect modules for connecting the Verilog-AMS unresolved net and the one or more VHDL-AMS digital objects.

18. The method of claim 17, wherein the connect module comprises:
    a digital port for interfacing with the VHDL-AMS digital object; and
    an analog port for interfacing with the Verilog-AMS unresolved net.

* * * * *